(12) United States Patent
Casino et al.

(10) Patent No.: US 12,512,825 B2
(45) Date of Patent: Dec. 30, 2025

(54) CONTROL SIGNAL GENERATION FOR A DELAY LINE

(71) Applicant: QUALCOMM Incorporated, San Diego, CA (US)

(72) Inventors: Alexander Casino, San Diego, CA (US); Ying Duan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 56 days.

(21) Appl. No.: 18/586,267

(22) Filed: Feb. 23, 2024

(65) Prior Publication Data

US 2025/0274110 A1 Aug. 28, 2025

(51) Int. Cl.
*H03K 5/14* (2014.01)
*H03K 5/133* (2014.01)
*H03K 19/21* (2006.01)

(52) U.S. Cl.
CPC ............... *H03K 5/14* (2013.01); *H03K 5/133* (2013.01); *H03K 19/21* (2013.01)

(58) Field of Classification Search
CPC ........... H03K 5/14; H03K 5/133; H03K 19/21
See application file for complete search history.

(56) References Cited

U.S. PATENT DOCUMENTS 7,348,823 B2 * 3/2008 Takai .................... H03L 7/0818
327/158

FOREIGN PATENT DOCUMENTS

GB 2436406 A 9/2007

OTHER PUBLICATIONS

International Search Report and Written Opinion—PCT/US2025/011075—ISA/EPO—May 9, 2025.

* cited by examiner

*Primary Examiner* — Lincoln D Donovan
*Assistant Examiner* — James G Yeaman
(74) *Attorney, Agent, or Firm* — Loza & Loza, LLP

(57) ABSTRACT

A control circuit outputs a first control signal and a second control signal to a first control input and a second control input, respectively, of a programmable delay circuit. In certain aspects, the control circuit receives a rising edge of a delay control signal. In response to the rising edge of the delay control signal, the control circuit outputs a rising edge of the first control signal and a falling edge of the second control signal after the rising edge of the first control signal. The control circuit also receives a falling edge of the delay control signal. In response to the falling edge of the delay control signal, the control circuit outputs a rising edge of the second control signal and outputs a falling edge of the first control signal after the rising edge of the second control signal.

17 Claims, 11 Drawing Sheets

CONTROL SIGNAL GENERATION FOR A DELAY LINE

BACKGROUND

Field

Aspects of the present disclosure relate generally to delay lines, and more particularly, to control signal generation for a delay line.

Background

A digitally controlled delay line may be used to delay a signal by a digitally programmable delay. For example, the delay line may delay a data signal to adjust the timing of the data signal relative to a clock signal or another data signal. The delay line may include multiple delay circuits in which the delay of the delay line is programmed by programming the number of delay circuits through which the signal being delayed propagates.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a programmable delay circuit and a control circuit configured to receive a delay control signal. The control circuit includes a first control signal generator coupled to a first control input of the programmable delay circuit. The first control signal generator is configured to output a rising edge of a first control signal to the first control input in response to a rising edge of the delay control signal, and output a falling edge of the first control signal to the first control input in response to a falling edge of the delay control signal. The control circuit also includes a second control signal generator coupled to a second control input of the programmable delay circuit. The second control signal generator is configured to output a falling edge of a second control signal to the second control input in response to the rising edge of the delay control signal, wherein the second control signal generator outputs the falling edge of the second control signal after the first control signal generator outputs the rising edge of the first control signal, and output a rising edge of the second control signal to the second control input in response to the falling edge of the delay control signal, wherein the first control signal generator outputs the falling edge of the first control signal after the second control signal generator outputs the rising edge of the second control signal.

A second aspect relates to a method for controlling a programmable delay circuit. The method includes receiving a rising edge of a delay control signal, outputting a rising edge of a first control signal to a first control input of the programmable delay circuit in response to the rising edge of the delay control signal, and, after outputting the rising edge of the first control signal, outputting a falling edge of a second control signal to a second control input of the programmable delay circuit in response to the rising edge of the delay control signal. The method also includes receiving a falling edge of the delay control signal, outputting a rising edge of the second control signal to the second control input of the programmable delay circuit in response to the falling edge of the delay control signal, and, after outputting the rising edge of the second control signal, outputting a falling edge of the first control signal to the first control input of the programmable delay circuit in response to the falling edge of the delay control signal.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
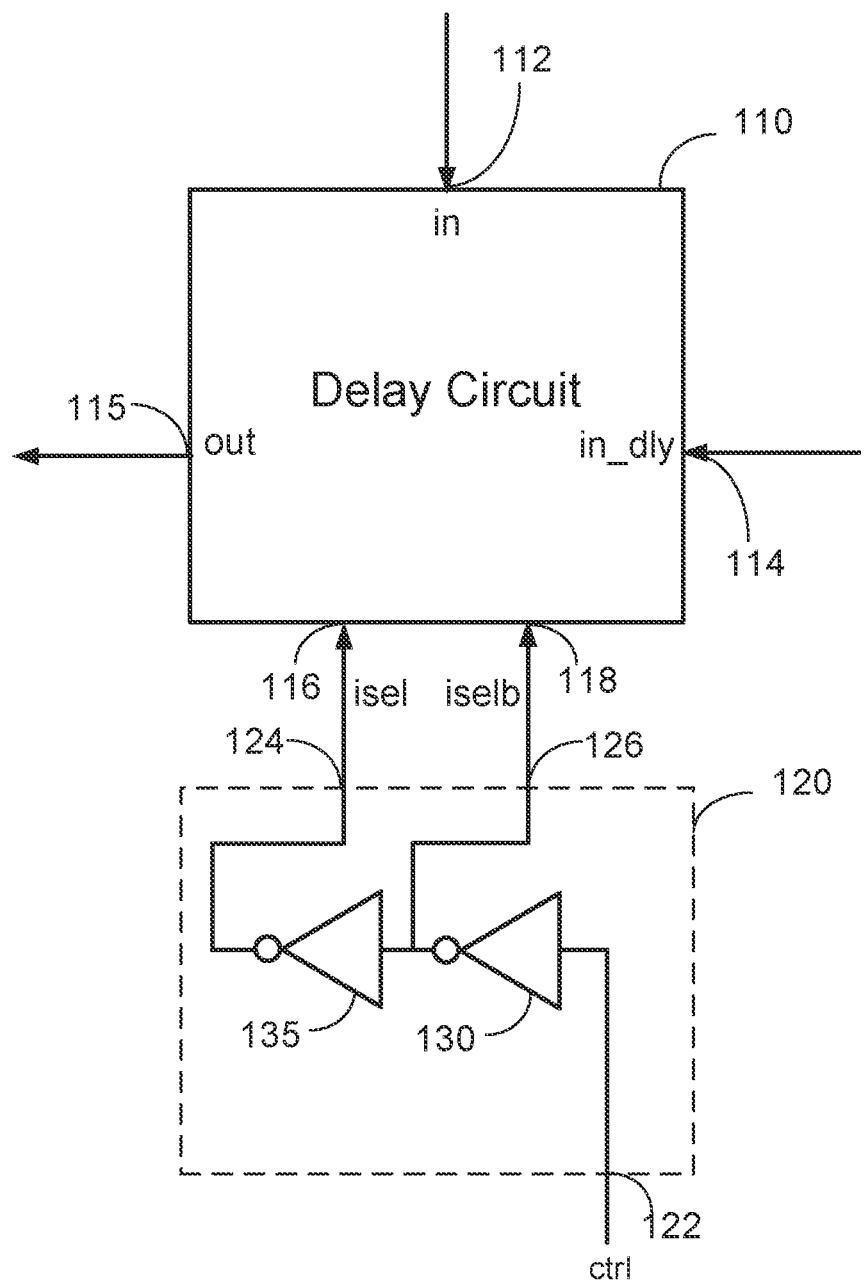
FIG. 1A shows an example of a delay circuit according to certain aspects of the present disclosure.

FIG. 1A shows an example of a delay circuit 110 according to certain aspects. As discussed further below, multiple instances (i.e., copies) of the delay circuit 110 may be coupled to form a digitally programmable delay line. The delay circuit 110 may also be referred to as a delay unit, a delay unit cell, a delay stage, or another term.

Figure 1B:
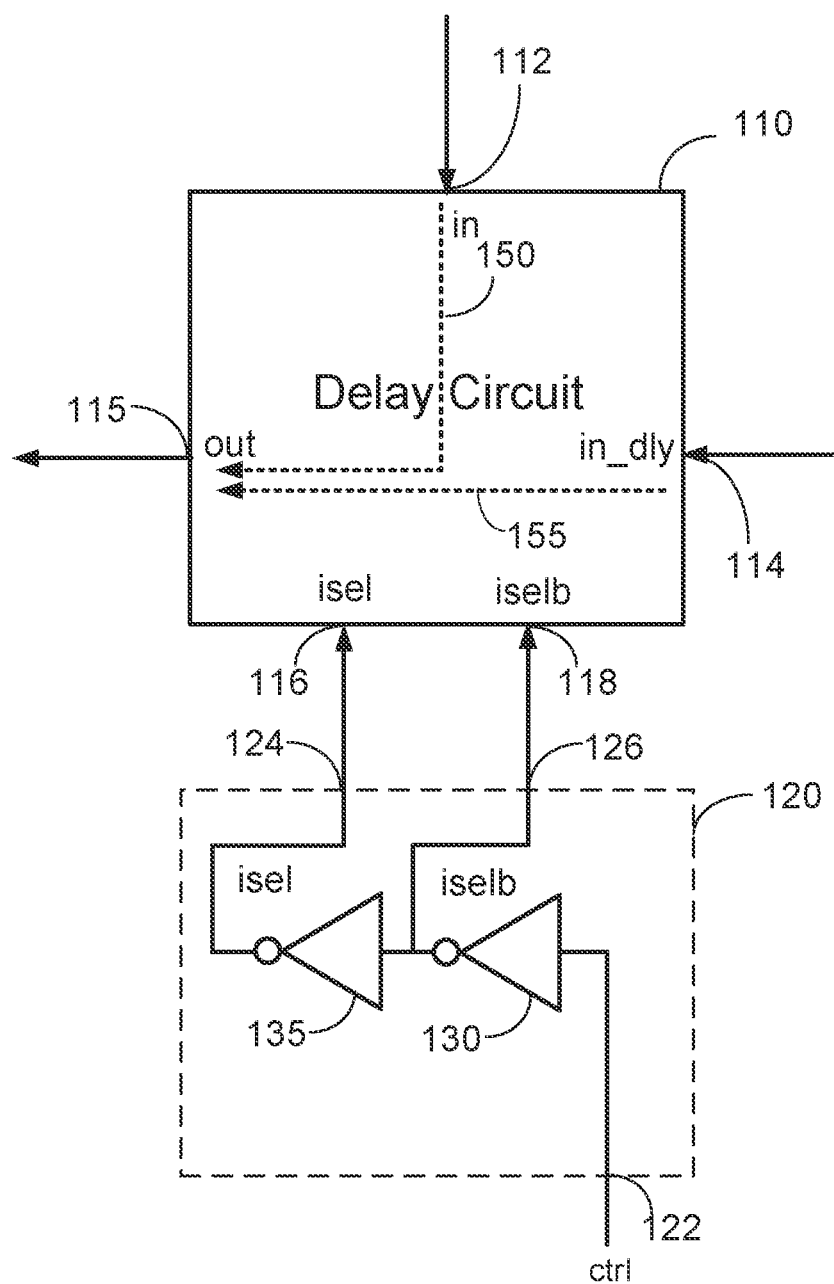
FIG. 1B shows an example of two programmable delay paths in the delay circuit according to certain aspects of the present disclosure.

In the example shown in FIG. 1A, the delay circuit 110 has a first delay input 112 (labeled "in"), a second delay input 114 (labeled "in_dly"), a first control input 116, a second control input 118, and an output 115 (labeled "out"). The delay circuit 110 includes a first delay path 150 and a second delay path 155, as shown in FIG. 1B. The first delay path 150 is coupled between the first delay input 112 and the output 115, and the second delay path 155 is coupled between the second delay input 114 and the output 115. The delay circuit 110 is configured to enable the first delay path 150 and disable the second delay path 155 in a first mode, and disable the first delay path 150 and enable the second delay path 155 in a second mode. Thus, in the first mode, the delay circuit 110 is configured to receive a signal at the first delay input 112 and propagate the signal to the output 115 through the first delay path 150. In the second mode, the delay circuit 110 is configured to receive a signal at the second delay input 114 and propagate the signal to the output 115 through the second delay path 155.

The delay circuit 110 is configured to receive a first control signal isel at the first control input 116 and a second control signal iselb at the second control input 118, and operate in the first mode or the second mode based on the first and second control signals isel and iselb (e.g., based on a bit value of the first control signal isel and a bit value of the second control signal iselb). For example, the delay circuit 110 may operate in the first mode when the first control signal isel is high (i.e., logic one) and the second control signal iselb is low (i.e., logic zero), and operate in the second mode when the first control delay isel is low (i.e., logic zero) and the second control signal iselb is high (i.e., logic one), or vice versa. In this regard, the delay circuit 110 may also be referred to as a programmable delay circuit.

FIG. 1A also shows an example of a control circuit 120 configured to generate the control signals isel and iselb based on a delay control signal ctrl (e.g., based on a bit value of the delay control signal ctrl). The control circuit 120 has an input 122, a first output 124 coupled to the first control input 116 of the delay circuit 110, and a second output 126 coupled to the second control input 118 of the delay circuit 110. In this example, the control circuit 120 is configured to receive the delay control signal ctrl at the input 122, generate the first and second control signals isel and iselb based on the delay control signal ctrl, output the first control signal isel at the first output 124, and output the second control signal iselb at the second output 126. For example, the control circuit 120 may set the first control signal isel high and set the second control signal iselb low when the delay control signal ctrl is high (i.e., logic one), and set the first control signal isel low and set the second control signal iselb high when the delay control signal ctrl is low (i.e., logic zero), or vice versa.

In the example shown in FIG. 1A, the control circuit 120 includes a first inverter 130 and a second inverter 135 coupled in series between the input 122 and the first output 124 of the control circuit 120. The input of the first inverter 130 is coupled to the input 122 of the control circuit 120, and the output of the first inverter 130 is coupled to the second output 126 of the control circuit 120. The input of the second inverter 135 is coupled to the output of the first inverter 130, and the output of the second inverter 135 is coupled to the first output 124 of the control circuit 120. In this example, the delay control signal ctrl propagates through the first inverter 130 to generate the second control iselb, and the delay control signal ctrl propagates through the first inverter 130 and the second inverter 135 to generate the first control isel. However, it is to be appreciated that the present disclosure is not limited to this example.

Figure 2:
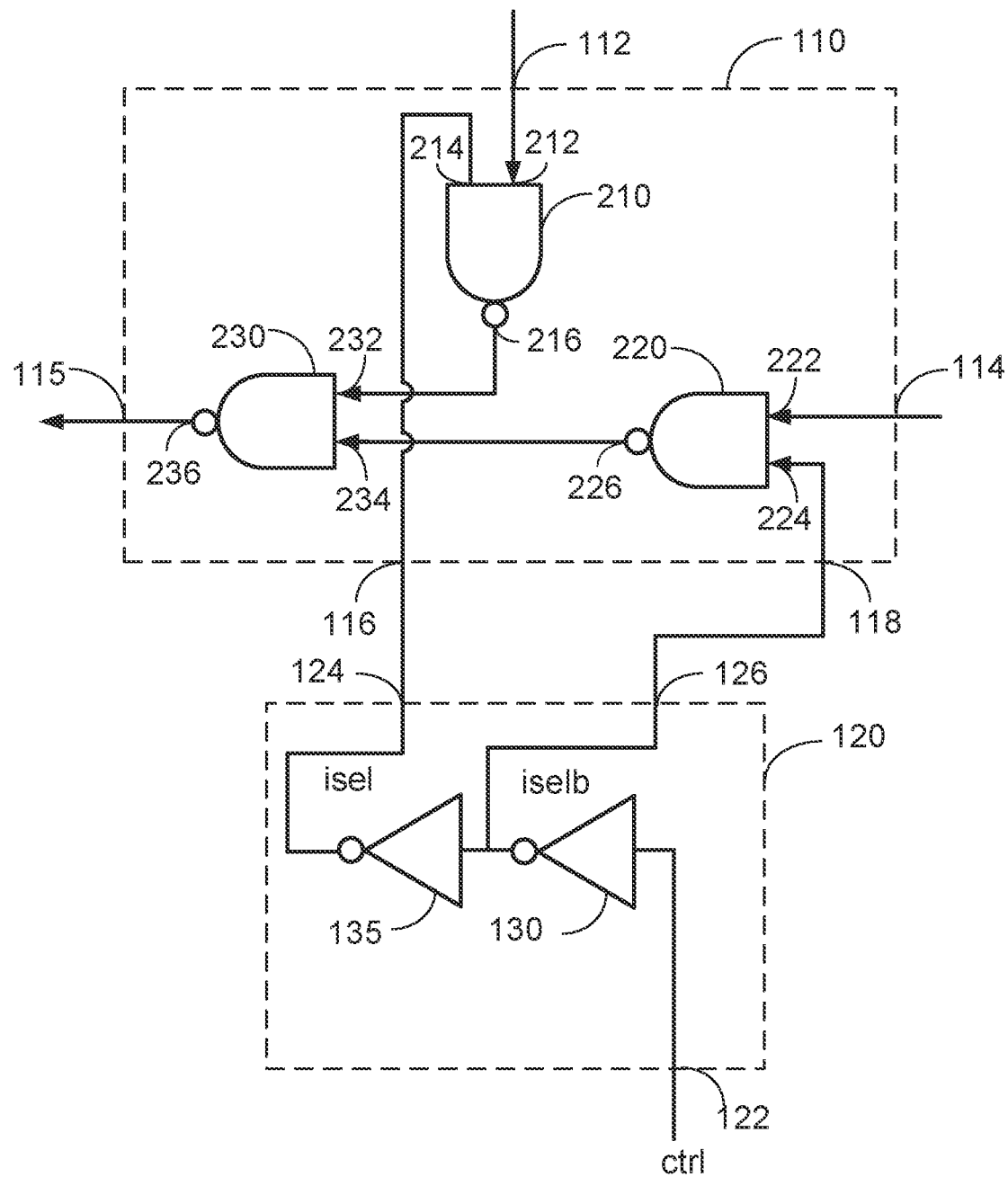
FIG. 2 shows an exemplary implementation of the delay circuit of FIGS. 1A and 1B according to certain aspects of the present disclosure.

FIG. 2 shows an exemplary implementation of the delay circuit 110 according to certain aspects. In this example, the delay circuit 110 includes a first NAND gate 210, a second NAND gate 220, and a third NAND gate 230. The first NAND gate 210 has a first input 212 coupled to the first delay input 112 of the delay circuit 110, a second input 214 coupled to the first control input 116 of the delay circuit 110, and an output 216. In this example, the second input 214 of the first NAND gate 210 receives the first control signal isel from the first control input 116. The second NAND gate 220 has a first input 222 coupled to the second delay input 114 of the delay circuit 110, a second input 224 coupled to the second control input 118 of the delay circuit 110, and an output 226. In this example, the second input 224 of the second NAND gate 220 receives the second control signal iselb from the second control input 118. The third NAND gate 230 has a first input 232 coupled to the output 216 of the first NAND gate 210, a second input 234 coupled to the output 226 of the second NAND gate 220, and an output 236 coupled to the output 115 of the delay circuit 110.

In this example, the first delay path 150 traverses the first NAND gate 210 and the third NAND gate 230, and the second delay path 155 traverses the second NAND gate 220 and the third NAND gate 230. Thus, in this example, the third NAND gate 230 is common to both delay paths 150 and 155. The time delay of each of the delay paths 150 and 155 is approximately equal to the sum of the delays of two NAND gates (i.e., the sum of the delays of the first NAND gate 210 and the third NAND gate 230 for the first delay path 150, and the sum of the delays of the second NAND gate 220 and the third NAND gate 230 for the second delay path 155). Assuming the delay of the first NAND gate 210 and the delay of the second NAND gate 220 are closely matched, the delay of the first delay path 150 and the delay of the second delay path 155 are approximately equal.

In this example, the delay circuit 110 operates in the first mode (i.e., enables the first delay path 150) when the first control signal isel is high (i.e., logic one) and the second control signal iselb is low (i.e., logic zero). In this case, the first control signal isel (which is high) causes the first NAND gate 210 to invert the signal at the first delay input 112 of the delay circuit 110 and output the inverse of the signal to the first input 232 of the third NAND gate 230. The second control signal iselb (which is low) causes the second NAND gate 220 to output a logic one to the second input 234 of the third NAND gate 230 regardless of the logic state at the second delay input 114 of the delay circuit 110. As a result, the second delay path 155 is disabled.

The logic one at the second input 234 of the third NAND gate 230 causes the third NAND gate 230 to invert the inverse of the signal at the first input 232 of the third NAND gate 230 and output the signal at the output 115 of the delay circuit 110. Thus, in this case, the signal at the first delay input 112 of the delay circuit 110 propagates through the first NAND gate 210 and the third NAND gate 230 and is output at the output 115 of the delay circuit 110.

In this example, the delay circuit 110 operates in the second mode (i.e., enables the second delay path 155) when the first control signal isel is low (i.e., logic zero) and the second control signal iselb is high (i.e., logic one). In this case, the first control signal isel (which is low) causes the first NAND gate 210 to output a logic one to the first input 232 of the third NAND gate 230 regardless of the logic state at the first delay input 112 of the delay circuit 110. As a result, the first delay path 150 is disabled. The second control signal iselb (which is high) causes the second NAND gate 220 to invert the signal at the second delay input 114 of the delay circuit 110 and output the inverse of the signal to the second input 234 of the third NAND gate 230.

The logic one at the first input 232 of the third NAND gate 230 causes the third NAND gate 230 to invert the inverse of the signal at the second input 234 of the third NAND gate 230 and output the signal at the output 115 of the delay circuit 110. Thus, in this case, the signal at the second delay input 114 of the delay circuit 110 propagates through the second NAND gate 220 and the third NAND gate 230 and is output at the output 115 of the delay circuit 110.

It is to be appreciated that the delay circuit 110 is not limited to the exemplary implementation shown in FIG. 2. For example, the delay circuit 110 is not limited to three NAND gates, and may include a different number of NAND gates and/or other types of logic gates in other implementations. In general, the delay circuit 110 may be implemented with any suitable arrangement of logic gates.

Figure 3:
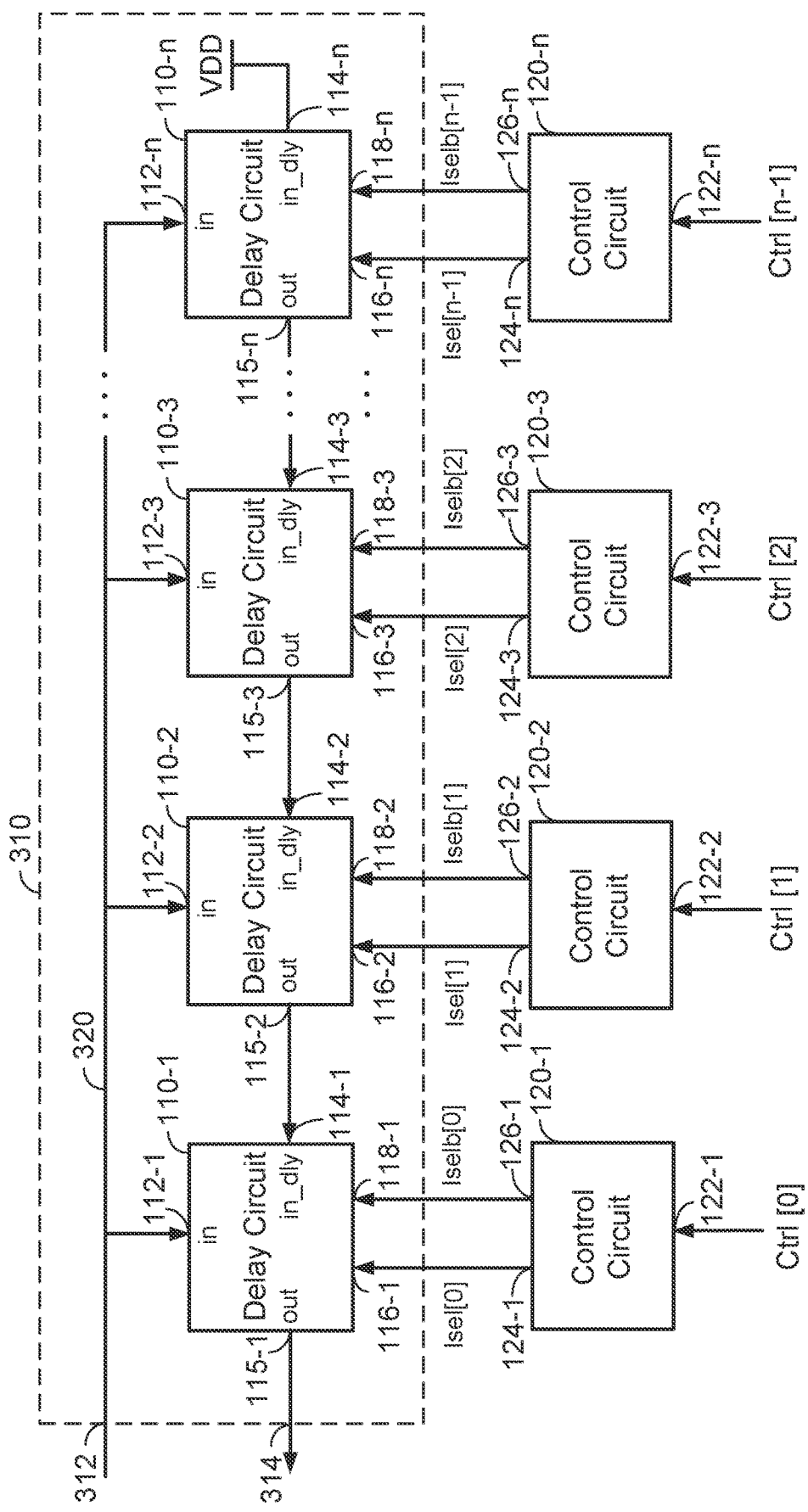
FIG. 3 shows an example of a delay line including multiple instances of the delay circuit of FIGS. 1A and 1B according to certain aspects of the present disclosure.

As discussed above, multiple instances (i.e., copies) of the delay circuit 110 may be coupled to form a digitally programmable delay line. In this regard, FIG. 3 shows an example of a digitally programmable delay line 310 including delay circuits 110-1 to 110-$n$, in which each of the delay circuits 110-1 to 110-$n$ is a separate instance of the delay circuit 110. The delay line 310 may also be referred to as a delay circuit or another term.

In this example, the delay line 310 has an input 312 and an output 314. The delay line 310 is configured to receive a signal at the input 312, delay the signal by a programmable (i.e., tunable) delay, and output the delayed signal at the output 314. The signal may be a data signal, a clock signal, or another type of signal. For example, the delay line 310 may be used to adjust the timing of a data signal relative to a clock signal (e.g., to adjust clock-data skew) or another data signal. In certain aspects, the delay line 310 may be used in conjunction with another delay line (not shown) by coupling the delay line 310 in series with the other delay line. In this example, the total delay of the signal is equal to the sum of the delay of the delay line 310 and the delay of the other delay line.

In this example, the first delay inputs 112-1 to 112-$n$ of the delay circuits 110-1 to 110-$n$ are coupled to the input 312 of the delay line 310 via a forward path 320. The output 115-1 of the delay circuit 110-1 is coupled to the output 314 of the delay line 310. The second delay input 114-1 to 114-$(n-1)$ of each of the delay circuits 110-1 to 110-$(n-1)$ is coupled to the output 115-2 to 115-$n$ of the delay circuit 110-2 to 110-$n$ to the immediate right, as shown in FIG. 3. The second delay input 114-$n$ of the delay circuit 110-$n$ may be coupled to a supply rail providing the supply voltage VDD (which corresponds to a logic one), as shown in FIG. 3. However, it is to be appreciated that the present disclosure is not limited to this example. Note that the delay circuits 110-4 to 110-$(n-1)$ are not explicitly shown in FIG. 3 for ease of illustration.

FIG. 3 also shows an example of control circuits 120-1 to 120-$n$ for controlling the delay circuits 110-1 to 110-$n$ based on respective delay control signals ctrl [0] to ctrl [n−1]. Each of the control circuits 120-1 to 120-$n$ may be a separate instance of the control circuit 120 shown in FIGS. 1A and 1B.

In this example, each of the control circuits 120-1 to 120-$n$ controls a respective one of the delay circuits 110-1 to 110-$n$ based on a respective one of the delay control signals ctrl [0] to ctrl [n−1]. The input 122-1 to 122-$n$ of each of the control circuits 120-1 to 120-$n$ is configured to receive the respective one of the delay control signals ctrl [0] to ctrl [n−1]. The first output 124-1 to 124-$n$ of each of the control circuits 120-1 to 120-$n$ is coupled to the first control input 116-1 to 116-$n$ of the respective one of the delay circuits 110-1 to 110-$n$, and the second output 126-1 to 126-$n$ of each of the control circuits 120-1 to 120-$n$ is coupled to the second control input 118-1 to 118-$n$ of the respective one of the delay circuits 110-1 to 110-$n$.

In operation, each of the control circuits 120-1 to 120-$n$ generates a respective first control signal isel [0] and isel [n−1] and a respective second control signal iselb [0] to iselb [n−1] based on the respective one of the delay control signals ctrl [0] to ctrl [n−1]. Each of the control circuits 120-1 to 120-$n$ outputs the respective first control signal isel [0] and isel [n−1] to the first control input 116-1 to 116-$n$ of the respective one of the delay circuits 110-1 to 110-$n$, and outputs the respective second control signal iselb [0] to iselb [n−1] to the second control input 118-1 to 118-$n$ of the respective one of the delay circuits 110-1 to 110-$n$. Thus, each of the control circuits 120-1 to 120-$n$ controls whether the respective one of the delay circuits 110-1 to 110-$n$ operates in the first mode or the second mode based on the respective one of the delay control signals ctrl [0] to ctrl [n−1]. In certain aspects, the bit value of each of the delay control signals ctrl [0] to ctrl [n−1] controls whether the respective one of the delay circuits 110-1 to 110-$n$ operates in the first mode or the second mode.

Figure 4:
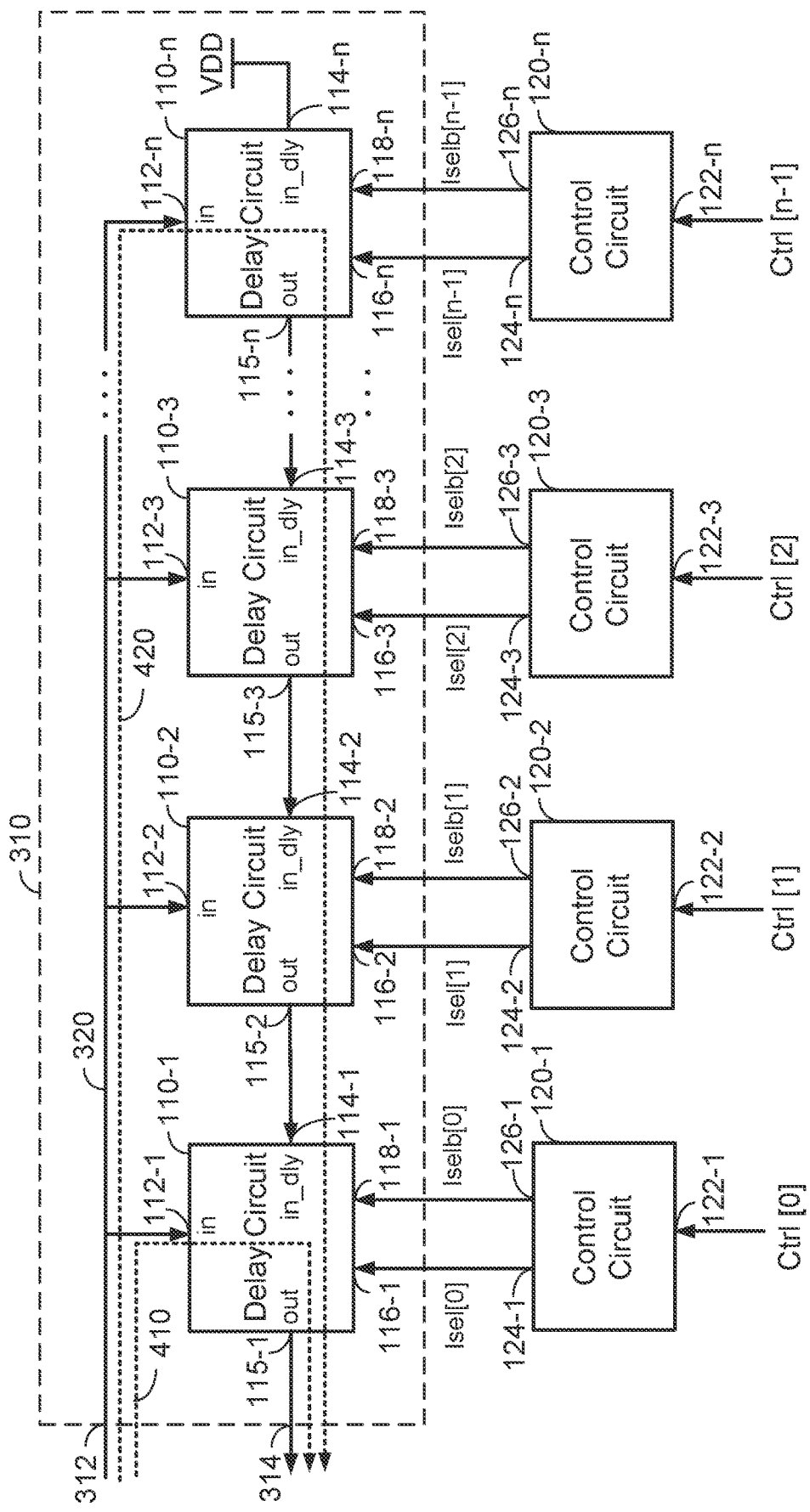
FIG. 4 shows an example of delay paths in the delay line of FIG. 3 according to certain aspects of the present disclosure.

In this example, the control circuits 120-1 to 120-$n$ program the delay of the delay line 310 by enabling one of multiple delay paths in the delay line 310 based on the control signals ctrl [0] to ctrl [n−1]. In this regard, FIG. 4A shows an example of a first delay path 410 and a second delay path 420 that may be enabled in the delay line 310 using the control signals ctrl [0] to ctrl [n−1].

The first delay path 410 may be enabled by programming the delay circuit 110-1 to operate in the first mode and programming the remaining delay circuits 110-2 to 110-$n$ to operate in the second mode using the control signals ctrl [0] to ctrl [n−1]. In this example, the signal received at the input 312 of the delay line 310 propagates to the output 314 of the delay line 310 through the delay circuit 110-1, as shown in FIG. 4A. Thus, in this example, the delay of the delay line 310 is approximately equal to the delay of the delay circuit 110-1.

The second delay path 420 may be enabled by programming the delay circuit 110-$n$ to operate in the first mode and programming the remaining delay circuits 110-1 to 110-$(n-1)$ to operate in the second mode using the control signals ctrl [0] to ctrl [n−1]. In this example, the signal received at the input 312 of the delay line 310 propagates to the output 314 of the delay line 310 through the delay circuits 110-1 to 110-$n$, as shown in FIG. 4A. Thus, in this example, the delay of the delay line 310 is approximately equal to the sum of the delays of the delay circuits 110-1 to 110-$n$.

In this example, the first delay path 410 corresponds to the shortest delay path of the delay line 310 and the second delay path 420 corresponds to the longest delay path of the delay line 310. The delay line 310 supports other delay paths having delays between the delay of the first delay path 410 and the delay of the second delay path 420.

A challenge with the delay line 310 is that the delay line 310 may generate and output a glitch when the delay line 310 switches delay paths in response to a change in the control signals ctrl [0] to ctrl [n−1]. The glitch may be in the form of a narrow pulse that causes a malfunction (e.g., a timing violation) in one or more circuits (e.g. a flip-flop)

coupled to the output 314 of the delay line 310. The narrow pulse may be a negative pulse or a positive pulse.

For example, one of the delay circuits 110-1 to 110-*n* may generate a glitch when the respective one of the control signals ctrl [0] to ctrl [n−1] changes logic states to switch the delay path of the delay line 310. This may be explained by way of example with reference to the exemplary implementation of the delay circuit 110 shown in FIG. 2.

In this example, a glitch may occur when the delay control signal ctrl transitions from high (i.e., logic one) to low (i.e., logic zero), which corresponds to a falling edge in the delay control signal ctrl. The falling edge of the delay control signal ctrl causes a falling edge in the first control signal isel and a rising edge in the second control signal iselb. In some cases, there may be a positive skew between the first control signal isel and the second control signal iselb in which the falling edge of the first control signal isel arrives at the first NAND gate 210 before the rising edge of the second control signal iselb arrives at the second NAND gate 220. The positive skew may be due to, for example, device mismatch, routing mismatch, process-voltage-temperature (PVT) variation, and/or another factor.

In this example, the positive skew causes the first control signal isel at the first NAND gate 210 and the second control signal iselb at the second NAND gate 220 to both be simultaneously low (i.e., logic zero) for a short period of time between the time the falling edge of the first control signal isel arrives at the first NAND gate 210 and the time the rising edge of the second control signal iselb arrives at the second NAND gate 220. This, in turn, causes both of the delay paths 150 and 155 of the delay circuit 110 to be simultaneously disabled for the short period of time, which may potentially generate a glitch. For example, in the exemplary implementation shown in FIG. 2, the third NAND gate 230 outputs a logic zero when both delay paths 150 and 155 are simultaneously disabled regardless of the logic state of the signal being delayed by the delay line 310. In this example, the logic zero at the third NAND gate 230 may generate a glitch when the signal being delayed by the delay line 310 has a logic state of one.

A glitch may also occur when the delay control signal ctrl transitions from low to high, which corresponds to a rising edge in the delay control signal ctrl. The rising edge of the delay control signal ctrl causes a rising edge in the first control signal isel and a falling edge in the second control signal iselb. In some cases, there may be a negative skew between the first control signal isel and the second control signal iselb in which the falling edge of the second control signal iselb arrives at the second NAND gate 220 before the rising edge of the first control signal isel arrives at the first NAND gate 210. The negative skew may be due to, for example, device mismatch, routing mismatch, PVT variation, and/or another factor.

In this example, the negative skew causes the first control signal isel at the first NAND gate 210 and the second control signal iselb at the second NAND gate 220 to both be simultaneously low for a short period of time between the time the falling edge of the second control signal iselb arrives at the second NAND gate 220 and the time the rising edge of the first control signal isel arrives at the first NAND gate 210. This, in turn, causes both of the delay paths 150 and 155 of the delay circuit 110 to be simultaneously disabled for the short period of time, which may potentially generate a glitch, as discussed above.

Thus, when the delay control ctrl transitions from high to low (i.e., there is a falling edge in the delay control signal ctrl), a glitch may be generated when there is positive skew between the first control signal isel and the second control signal iselb (i.e., the falling edge of the first control signal isel arrives before the rising edge of the second control signal iselb). When the delay control ctrl transitions from low to high (i.e., there is a rising edge in the delay control signal ctrl), a glitch may be generated when there is a negative skew between the first control signal isel and the second control signal (i.e., the falling edge of the second control signal iselb arrives before the rising edge of the first control signal isel).

To address the above, aspects of the present disclosure provide exemplary implementations of the control circuit 120 in which the control circuit 120 is configured to provide timing margins that help prevent a glitch in the delay circuit 110 when the delay circuit 110 switches delay paths, as discussed further below.

Figure 5:
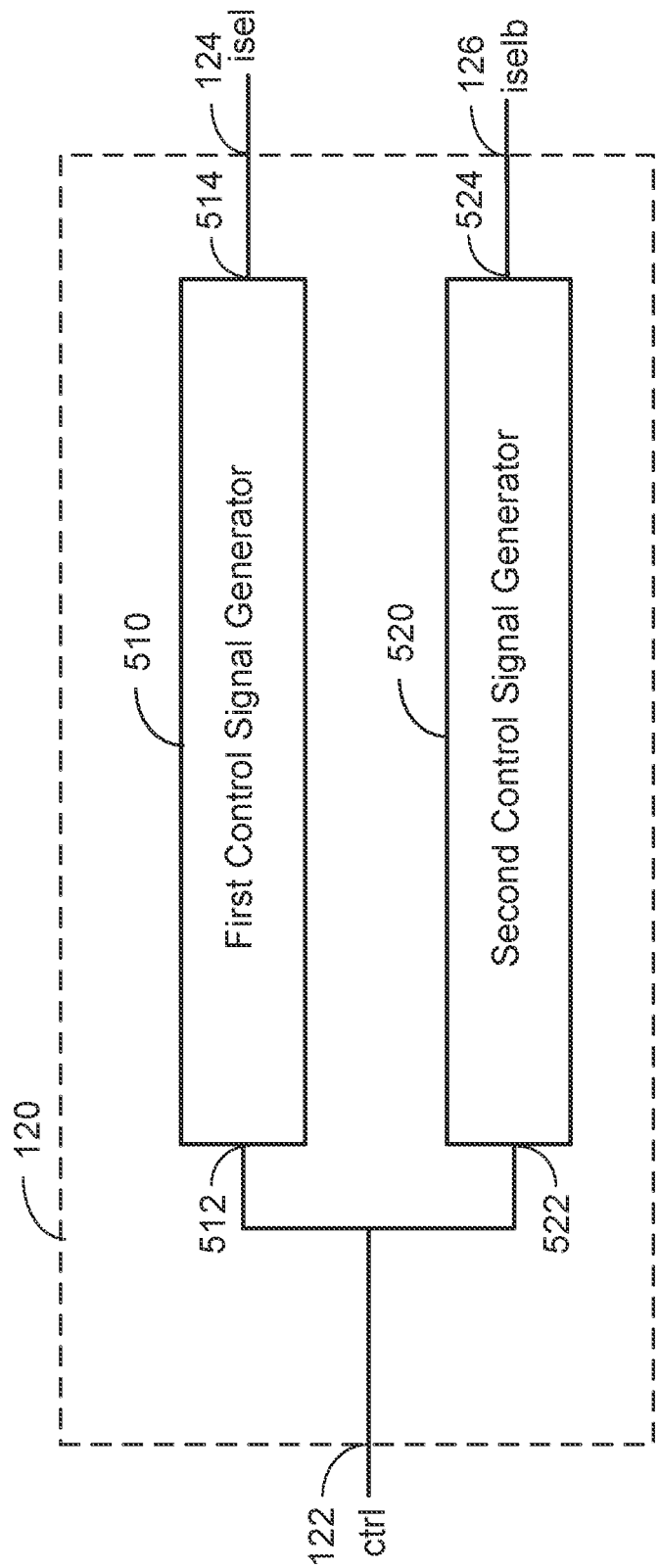
FIG. 5 shows an exemplary implementation of a control circuit including a first control signal generator and a second control signal generator according to certain aspects of the present disclosure.

FIG. 5 shows an exemplary implementation of the control circuit 120 according to certain aspects. In this example, the control circuit 120 incudes a first control signal generator 510 and a second control signal generator 520.

The first control signal generator 510 has an input 512 coupled to the input 122 of the control circuit 120, and an output 514 coupled to the first output 124 of the control circuit 120. The first control signal generator 510 is configured to generate the first control signal isel based on the delay control signal ctrl. When the first control signal generator 510 receives a rising edge of the delay control signal ctrl at the input 512, the first control signal generator 510 is configured output a rising edge of the first control signal isel at the output 514 in response to the rising edge of the delay control signal ctrl. When the first control signal generator 510 receives a falling edge of the delay control signal ctrl at the input 512, the first control signal generator 510 is configured output a falling edge of the first control signal isel at the output 514 in response to the falling edge of the delay control signal ctrl. As discussed further below, the first control signal generator 510 delays the output of the falling edge of the first control signal isel to provide a first timing margin to prevent a glitch due to positive skew.

The second control signal generator 520 has an input 522 coupled to the input 122 of the control circuit 120, and an output 524 coupled to the second output 126 of the control circuit 120. The second control signal generator 520 is configured to generate the second control signal iselb based on the delay control signal ctrl. In this example, when the second control signal generator 520 receives the rising edge of the delay control signal ctrl at the input 522, the second control signal generator 520 is configured output a falling edge of the second control signal iselb at the output 524 in response to the rising edge of the delay control signal ctrl. As discussed further below, the second control signal generator 520 delays the output of the falling edge of the second control signal isel to provide a second timing margin to prevent a glitch due to negative skew. When the second control signal generator 520 receives the falling edge of the delay control signal ctrl at the input 522, the second control signal generator 520 is configured output a rising edge of the second control signal iselb in response to the falling edge of the delay control signal ctrl.

In certain aspects, the first control signal generator 510 outputs a falling edge of the first control signal isel after the second control signal generator 520 outputs a rising edge of the second control signal iselb to provide a first timing margin for positive skew. An example of this is illustrated in FIG. 6A, which shows an exemplary timing diagram of the delay control signal ctrl at the input 122 of the control circuit 120, the first control signal isel at the first output 124 of the control circuit 120, and the second control signal iselb at the second output 126 of the control circuit 120.

Figure 6A:
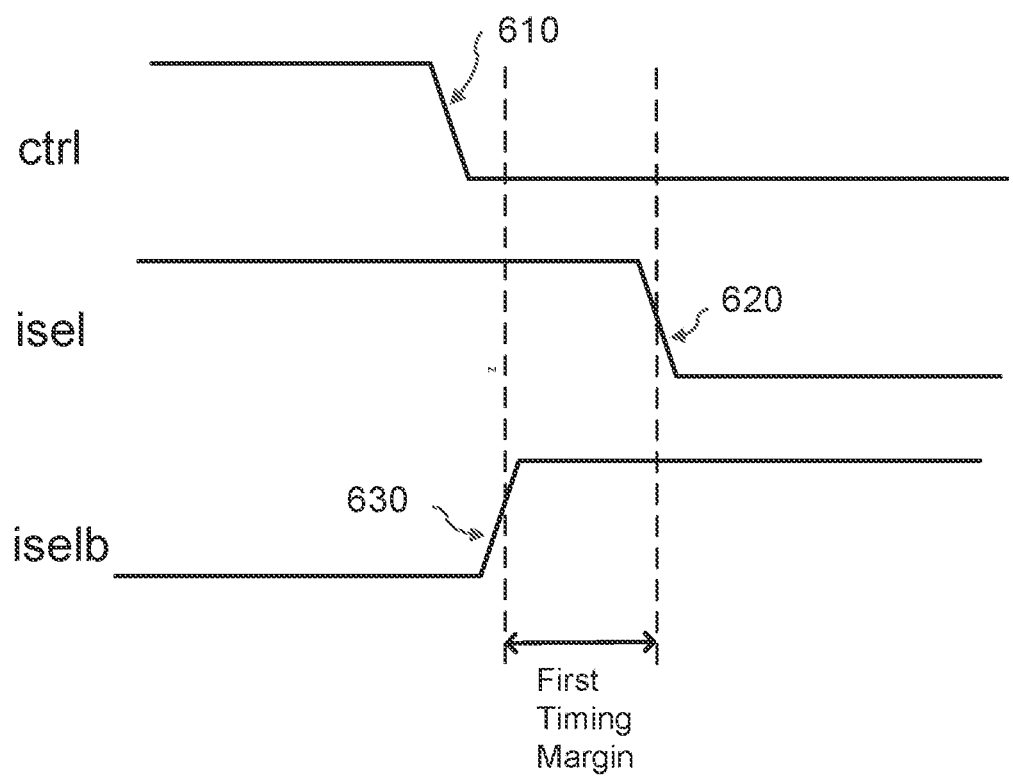
FIG. 6A is a timing diagram showing an example of a timing margin for preventing a glitch according to certain aspects of the present disclosure.

In the example in FIG. 6A, a falling edge 610 of the delay control signal ctrl arrives at the input 122 of the control circuit 120 corresponding to a transition of the delay control signal ctrl from high to low. In response to the falling edge 610, the first control signal generator 510 outputs a falling edge 620 of the first control signal isel and the second control signal generator 520 outputs a rising edge 630 of the second control signal iselb. As shown in FIG. 6A, the first control signal generator 510 outputs the falling edge 620 of the first control signal isel after the second control signal generator 520 outputs the rising edge 630 of the second control signal iselb to provide a first timing margin for positive skew.

For example, the first control signal generator 510 may delay the output of the falling edge 620 of the first control signal isel relative to the output of the rising edge 630 of the second control signal iselb by a first time delay to provide the first timing margin. The first timing margin helps ensure that the first delay path 150 in the delay circuit 110 is not disabled by the falling edge 620 of the first control signal isel until the second delay path 155 in the delay circuit 110 is enabled by the rising edge 630 of the second control signal isel to prevent a glitch due to positive skew.

In certain aspects, the second control signal generator 520 outputs a falling edge of the second control signal iselb after the first control signal generator 510 outputs a rising edge of the first control signal isel to provide a second timing margin for negative skew. An example of this is illustrated in FIG. 6B, which shows an exemplary timing diagram of the delay control signal ctrl at the input 122 of the control circuit 120, the first control signal isel at the first output 124 of the control circuit 120, and the second control signal iselb at the second output 126 of the control circuit 120.

Figure 6B:
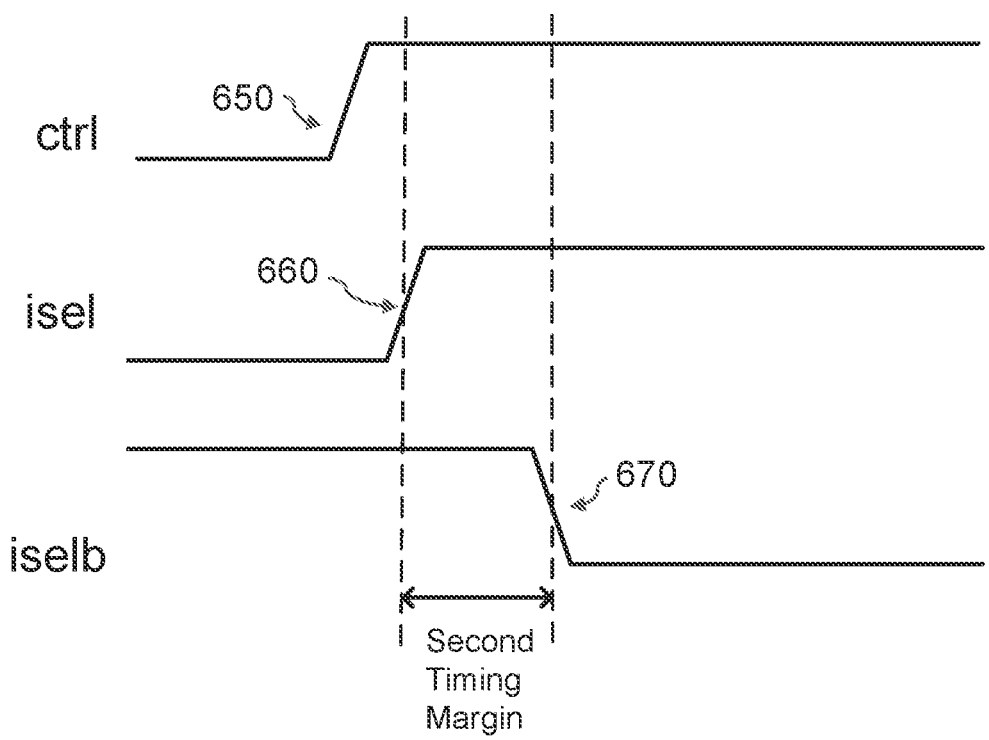
FIG. 6B is a timing diagram showing another example of a timing margin for preventing a glitch according to certain aspects of the present disclosure.

In the example in FIG. 6B, a rising edge 650 of the delay control signal ctrl arrives at the input 122 of the control circuit 120 corresponding to a transition of the delay control signal ctrl from high to low. In response to the rising edge 650, the first control signal generator 510 outputs a rising edge 660 of the first control signal isel and the second control signal generator 520 outputs a falling edge 670 of the second control signal iselb. As shown in FIG. 6B, the second control signal generator 520 outputs the falling edge 670 of the second control signal iselb after the first control signal generator 510 outputs the rising edge 660 of the first control signal isel to provide a second timing margin for negative skew.

For example, the second control signal generator 520 may delay the output of the falling edge 670 of the second control signal iselb relative to the output of the rising edge 660 of the first control signal isel by a second time delay to provide the second timing margin. The second timing margin helps ensure that the second delay path 155 in the delay circuit 110 is not disabled by the falling edge 670 of the second control signal iselb until the first delay path 150 in the delay circuit 110 is enabled by the rising edge 660 of the first control signal iselb to prevent a glitch due to negative skew.

Thus, the first timing margin helps prevent a glitch due to positive skew when the delay control signal ctrl transitions from high to low (e.g., falling edge 610), and the second timing margin helps prevent a glitch due to negative skew when the delay control signal transitions from low to high (e.g., rising edge 650). The timing margins allow the control circuit 120 and the delay circuit 110 to tolerate a larger amount of device mismatch, routing mismatch, and/or PVT variation without generating a glitch.

The exemplary implementation of the control circuit 120 shown in FIG. 5 may be used to implement each of the control circuits 120-1 to 120-1 in FIG. 3 to prevent glitches in the delay line 310.

Figure 7:
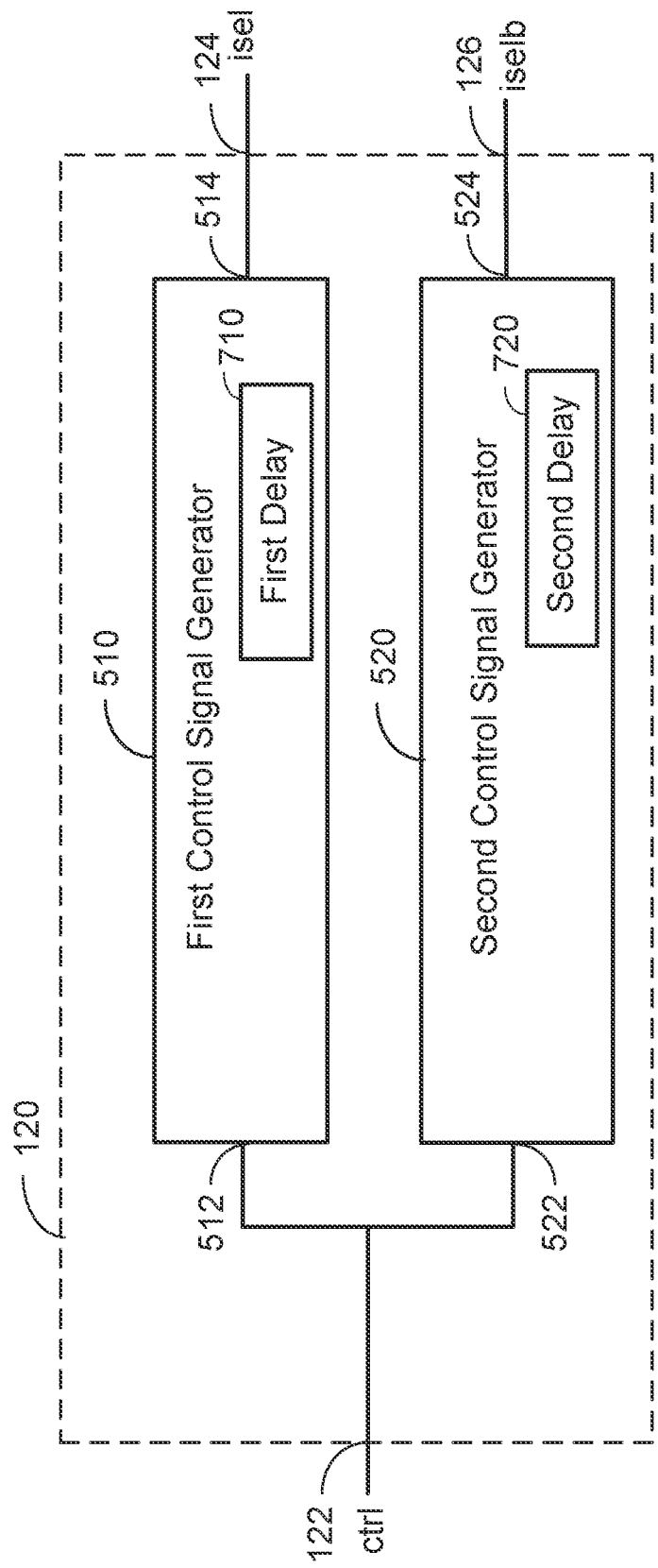
FIG. 7 shows an example in which the first control signal generator includes a first delay circuit and the second control signal generator includes a second delay circuit according to certain aspects of the present disclosure.

FIG. 7 shows an example in which the first control signal generator 510 includes a first delay circuit 710 configured to set the first timing margin. In this example, the first control signal generator 510 is configured to delay the output of the falling edge 620 of the first control signal isel relative to the output of the rising edge 630 of the second control signal iselb by the delay of the first delay circuit 710 to provide the first timing margin. Thus, the delay of the first delay circuit 710 sets the first timing margin in this example. Note that the delay of the first delay circuit 710 corresponds to the first time delay discussed above. The first delay circuit 710 may be implemented with delay buffers coupled is series. In certain aspects, the first delay circuit 710 may have a tunable delay to tune the first timing margin. In this example, the first control signal generator 510 does not delay the rising edge 660 of the first control signal isel using the first delay circuit 710.

FIG. 7 also shows an example in which the second control signal generator 520 includes a second delay circuit 720 configured to set the second timing margin. In this example, the second control signal generator 520 is configured to delay the output of the falling edge 670 of the second control signal iselb relative to the output of the rising edge 660 of the first control signal isel by the delay of the second delay circuit 720 to provide the second timing margin. Thus, the delay of the second delay circuit 720 sets the second timing margin in this example. Note that the delay of the second delay circuit 720 corresponds to the second time delay discussed above. The second delay circuit 720 may be implemented with delay buffers coupled is series. In certain aspects, the second delay circuit 720 may have a tunable delay to tune the second timing margin. In this example, the second control signal generator 520 does not delay the rising edge 630 of the second control signal iselb using the second delay circuit 720.

Figure 8:
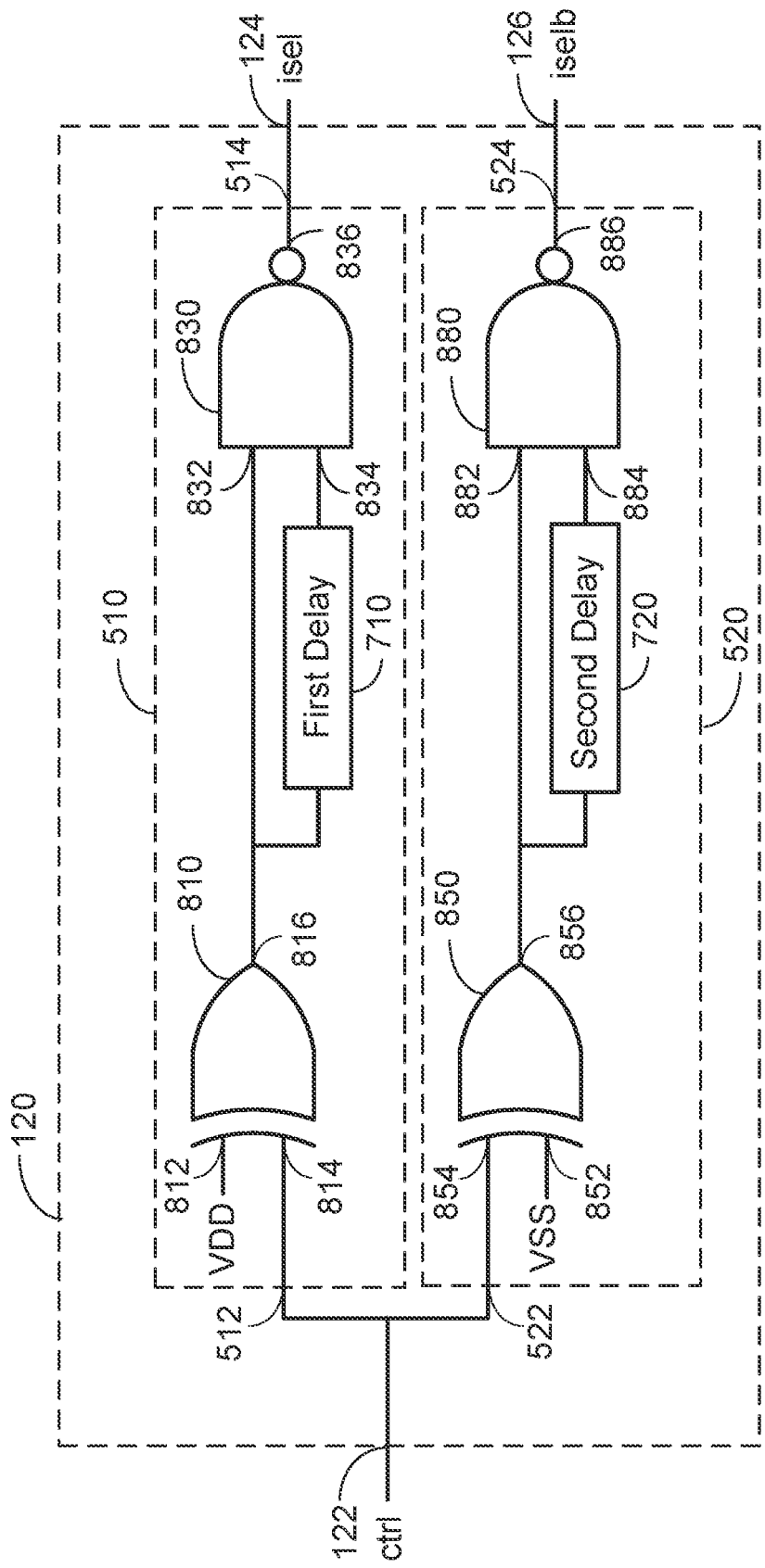
FIG. 8 shows an exemplary implementation of the first control signal generator and the second control signal generator according to certain aspects of the present disclosure.

FIG. 8 shows an exemplary implementation of the first control signal generator 510 and the second control signal generator 520 according to certain aspects.

In this example, the first control signal generator 510 includes a first exclusive-OR (XOR) gate 810, the first delay circuit 710, and a first NAND gate 830. The first XOR gate 810 has a first input 812 coupled to a supply rail providing the supply voltage VDD (which corresponds to logic one), a second input 814 coupled to the input 512 of the first control signal generator 510, and an output 816. The first NAND gate 830 has a first input 832 coupled to the output 816 of the first XOR gate 810, a second input 834, and an output 836 coupled to the output 514 of the first control signal generator 510. The first delay circuit 710 is coupled between the output 816 of the first XOR gate 810 and the second input 834 of the first NAND gate 830.

When a rising edge (e.g., rising edge 650) of the delay control signal ctrl is received at the second input of the first XOR gate 810, the first XOR gate 810 outputs a falling edge at the output 816. The falling edge is input to the first input 832 of the first NAND gate 830, which causes the first NAND gate 830 to output a rising edge (e.g., rising edge 660) of the first control signal isel at the output 514 without waiting for the falling edge from the first XOR gate 810 to propagate through the first delay circuit 710. This is because the first NAND gate 830 outputs a logic one when at least one of the inputs 832 and 834 is logic zero. Therefore, in this example, the delay of the first delay circuit 710 is not used to delay the output of the rising edge of the first control signal isel.

When a falling edge (e.g., falling edge 610) of the delay control signal ctrl is received at the second input 814 of the first XOR gate 810, the first XOR gate 810 outputs a rising edge at the output 816. The rising edge is input to the first input 832 of the first NAND gate 830. The rising edge also propagates to the second input 834 of the first NAND gate 830 through the first delay circuit 710. When the rising edge reaches the second input 834 of the first NAND gate 830 after the delay of the first delay circuit 710, the first NAND gate 830 outputs a falling edge (e.g., falling edge 620) of the first control signal isel at the output 514. Thus, the first control signal generator 510 delays the output of the falling edge of the first control signal isel using the first delay circuit 710.

In the example shown in FIG. 8, the second control signal generator 520 includes a second XOR gate 850, the second delay circuit 720, and a second NAND gate 880. The second XOR gate 850 has a first input 852 coupled to ground, a second input 854 coupled to the input 512 of the first control signal generator 510, and an output 856. The second NAND gate 880 has a first input 882 coupled to the output 856 of the second XOR gate 850, a second input 884, and an output 886 coupled to the output 524 of the second control signal generator 520. The second delay circuit 720 is coupled between the output 856 of the second XOR gate 850 and the second input 884 of the second NAND gate 880.

When a falling edge (e.g., falling edge 610) of the delay control signal ctrl is received at the second input 854 of the second XOR gate 850, the second XOR gate 850 outputs a falling edge at the output 856. The falling edge is input to the first input 882 of the second NAND gate 880, which causes the second NAND gate 880 to output a rising edge (e.g., rising edge 630) of the second control signal iselb at the output 524 without waiting for the falling edge from the second XOR gate 850 to propagate through the second delay circuit 720. This is because the second NAND gate 880 outputs a logic one when at least one of the inputs 882 and 884 is logic zero. Therefore, in this example, the delay of the second delay circuit 720 is not used to delay the output of the rising edge of the second control signal iselb.

When a rising edge (e.g., rising edge 650) of the delay control signal ctrl is received at the second input 854 of the second XOR gate 850, the second XOR gate 850 outputs a rising edge at the output 856. The rising edge is input to the first input 882 of the second NAND gate 880. The rising edge also propagates to the second input 884 of the second NAND gate 880 through the second delay circuit 720. When the rising edge reaches the second input 884 of the second NAND gate 880 after the delay of the second delay circuit 720, the second NAND gate 880 outputs a falling edge (e.g., falling edge 670) of the second control signal iselb at the output 524. Thus, the second control signal generator 520 delays the output of the falling edge of the second control signal iselb using the second delay circuit 720.

Assuming the propagation delays of the first XOR gate 810 and the first NAND gate 830 are closely matched to the propagation delays of the second XOR gate 850 and the second NAND gate 880, the first timing margin (which prevents a glitch due to positive skew) is approximately equal to the delay of the first delay circuit 710 and the second timing margin (which prevents a glitch due to negative skew) is approximately equal to the delay of the second delay circuit 720.

The delays of the first delay circuit 710 and the second delay circuit 720 may be approximately equal or may be different.

It is to be appreciated that each of the NAND gates 830 and 880 may be implemented with any combination of logic gates (e.g., one or more AND gates, one or more OR gates, one or more NOR gates, one or more inventors, etc.) arranged to perform a NAND operation. Similarly, it is to be appreciated that each of the XOR gates 810 and 850 may be implemented with any combination of logic gates arranged to perform an XOR operation.

It is to be appreciated that the first control signal generator 510 and the second control signal generator 520 are not limited to the exemplary implementation shown in FIG. 8. In this regard, it is to be understood that first control signal generator 510 and the second control signal generator 520 may each be implemented with any suitable circuit (e.g., any suitable arrangement of logic gates and the respective one of the delay circuits 710 and 720).

Figure 9:
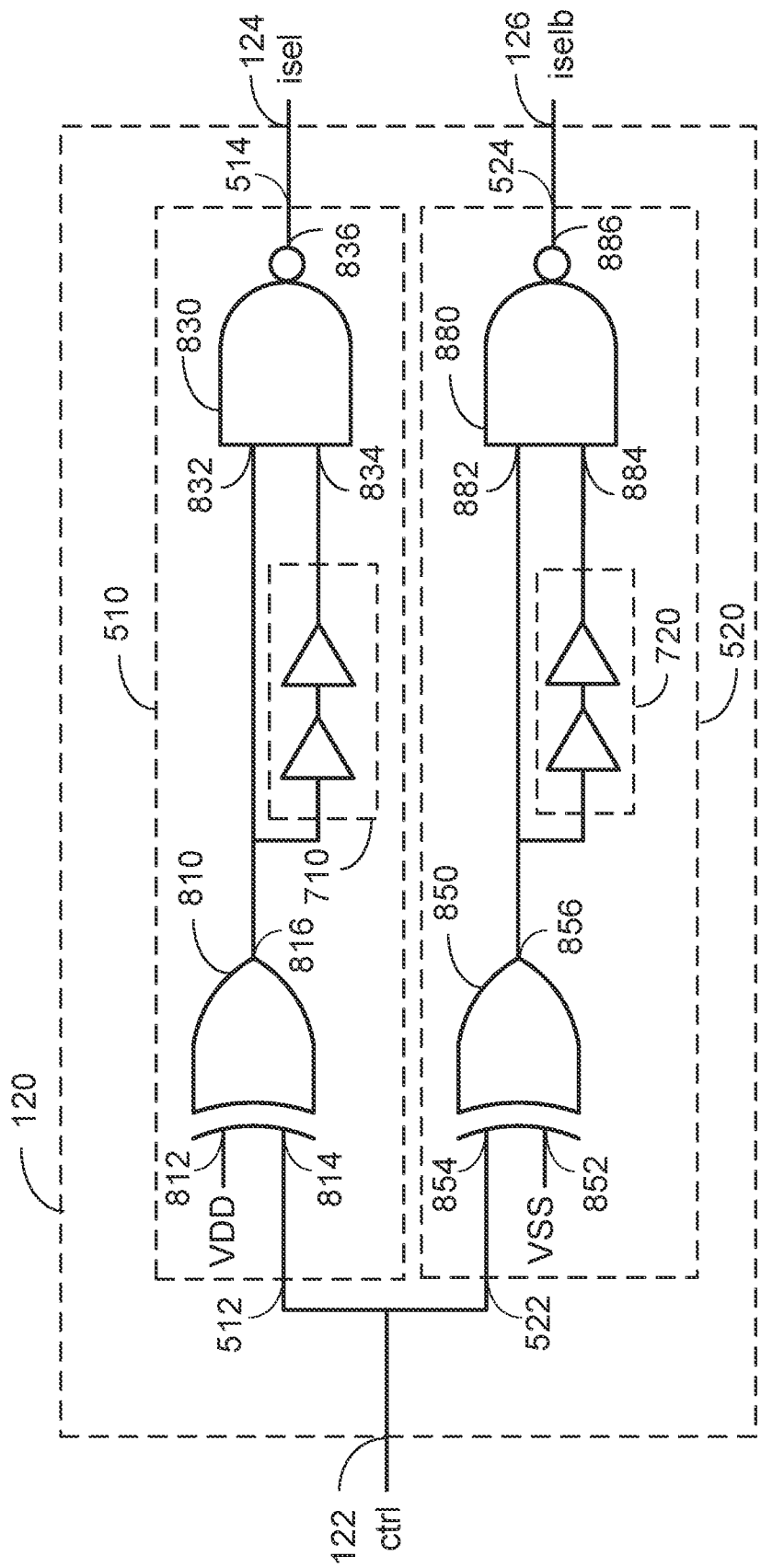
FIG. 9 shows an example in which the first delay circuit includes first delay buffers coupled in series and the second delay circuit includes second delay buffers coupled in series according to certain aspects of the present disclosure.

As discussed above, each of the first delay circuit 710 and the second delay circuit 720 may include delay buffers coupled in series. In this regard, FIG. 9 shows an example in which the first delay circuit 710 includes first delay buffers coupled in series and the second delay circuit 720 includes second delay buffers coupled in series. Although two delay buffers are shown for each of the delay circuits 710 and 720 in the example in FIG. 9, it is to be appreciated that each of the delay circuits 710 and 720 may include any number of delay buffers coupled in series. A delay buffer may be implemented with an inverter or another type of delay buffer.

In certain aspects, the first delay circuit 710 may have a first tunable delay and the second delay circuit 720 may have a second tunable delay. In this example, the first tunable delay and the second tunable delay may be independently tuned to independently tune the first timing margin and the second timing margin. A tunable delay may be implemented, for example, using delay buffers with programmable drive strengths and/or delay buffers coupled to load capacitors with programmable capacitances.

It is to be appreciated that the first and second control signal generators 510 and 520 are not limited to the exemplary logic gates (e.g., NAND gates, etc.) shown in FIG. 8. One skilled in the art will recognize that the first and second control signal generators 510 and 520 may be implemented with other alternative combinations of logic gates.

Figure 10:
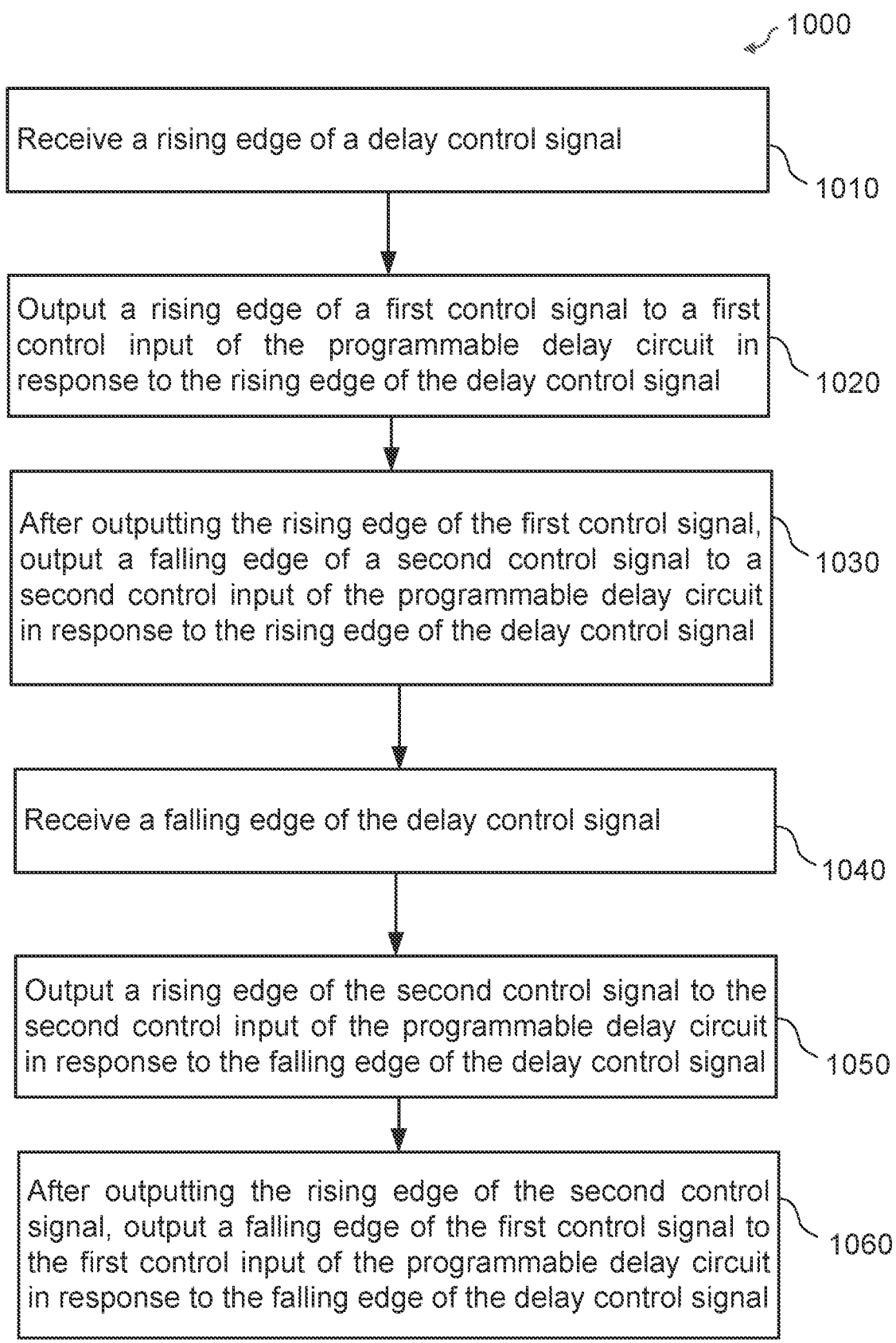
FIG. 10 is a flowchart illustrating a method for controlling a programmable delay circuit according to certain aspects of the present disclosure.

FIG. 10 shows an example of a method 1000 for controlling a programmable delay circuit (e.g., the delay circuit 110) according to certain aspects.

At block 1010, a rising edge of a delay control signal is received. For example, the delay control signal may correspond to the delay control signal ctrl and the rising edge of the delay control signal may correspond to the rising edge 650.

At block 1020, a rising edge of a first control signal is output to a first control input of the programmable delay circuit in response to the rising edge of the delay control signal. For example, the rising edge of the first control signal may be output by the first control signal generator 510. The first control signal may correspond to the first control signal isel and the rising edge of the first control signal may correspond to the rising edge 660. The first control input may correspond to the first control input 116.

At block 1030, after the rising edge of the first control signal is output, a falling edge of a second control signal is output to a second control input of the programmable delay circuit in response to the rising edge of the delay control signal. For example, the falling edge of the second control signal may be output by the second control signal generator 520. The second control signal may correspond to the second control signal iselb and the falling edge of the second control signal may correspond to the falling edge 670. The second control input may correspond to the second control input 118.

At block 1040, a falling edge of the delay control signal is received. For example, the falling edge of the delay control signal may correspond to the falling edge 610.

At block 1050, a rising edge of the second control signal is output to the second control input of the programmable delay circuit in response to the falling edge of the delay control signal. For example, the rising edge of the second control signal may correspond to the rising edge 630.

At block 1060, after the rising edge of the second control signal is output, a falling edge of the first control signal is output to the first control input of the programmable delay circuit in response to the falling edge of the delay control signal. For example, the falling edge may correspond to the falling edge 620.

The method 1000 may also include setting a first timing margin between the falling edge of the first control signal and the rising edge of the second control signal using a first delay circuit. For example, the first delay circuit may correspond to the first delay circuit 710.

The method 1000 may further include setting a second timing margin between the falling edge of the second control signal and the rising edge of the first control signal using a second delay circuit. For example, the second delay circuit may correspond to the second delay circuit 720.

Implementation examples are described in the following numbered clauses:

1. A system, comprising:
   a programmable delay circuit; and
   a control circuit configured to receive a delay control signal, the control circuit comprising:
   a first control signal generator coupled to a first control input of the programmable delay circuit, wherein the first control signal generator is configured to:
   output a rising edge of a first control signal to the first control input in response to a rising edge of the delay control signal; and
   output a falling edge of the first control signal to the first control input in response to a falling edge of the delay control signal; and
   a second control signal generator coupled to a second control input of the programmable delay circuit, wherein the second control signal generator is configured to:
   output a falling edge of a second control signal to the second control input in response to the rising edge of the delay control signal, wherein the second control signal generator outputs the falling edge of the second control signal after the first control signal generator outputs the rising edge of the first control signal; and
   output a rising edge of the second control signal to the second control input in response to the falling edge of the delay control signal, wherein the first control signal generator outputs the falling edge of the first control signal after the second control signal generator outputs the rising edge of the second control signal.
2. The system of clause 1, wherein the first control signal generator comprises a first delay circuit configured to set a first timing margin between the falling edge of the first control signal and the rising edge of the second control signal.
3. The system of clause 2, wherein the first delay circuit has a tunable delay.
4. The system of clause 2 or 3, wherein the first delay circuit comprises delay buffers coupled in series.
5. The system of any one of clauses 2 to 4, wherein the second control signal generator comprises a second delay circuit configured to set a second timing margin between the falling edge of the second control signal and the rising edge of the first control signal.
6. The system of clause 5, wherein the first delay circuit comprises first delay buffers coupled in series, and the second delay circuit comprises second delay buffers coupled in series.
7. The system of clause 5 or 6, wherein the first delay circuit has a first tunable delay, and the second delay circuit has a second tunable delay.
8. The system of any one of clauses 1 to 7, wherein the first control signal generator comprises:
   a first exclusive-OR (XOR) gate having a first input coupled to a supply rail, a second input configured to receive the delay control signal, and an output;
   a first NAND gate having a first input coupled to the output of the first XOR gate, a second input, and an output coupled to the first control input of the programmable delay circuit; and
   a first delay circuit coupled between the output of the first XOR gate and the second input of the first NAND gate.
9. The system of clause 8, wherein the second control signal generator comprises:
   a second XOR gate having a first input coupled to a ground, a second input configured to receive the delay control signal, and an output;
   a second NAND gate having a first input coupled to the output of the second XOR gate, a second input, and an output coupled to the second control input of the programmable delay circuit; and
   a second delay circuit coupled between the output of the second XOR gate and the second input of the second NAND gate.
10. The system of any one of clauses 1 to 9, wherein the programmable delay circuit includes a first delay path, and the programmable delay circuit is configured to enable the first delay path when a logic state at the first control input is one and disable the first delay path when the logic state at the first control input is zero.
11. The system of clause 10, wherein the programmable delay circuit includes a second delay path, and the programmable delay circuit is configured to enable the second delay path when a logic state at the second control input is one and disable the second delay path when the logic state at the second control input is zero.
12. The system of clause 11, wherein the first delay path is between a first delay input of the programmable delay circuit and an output of the programmable delay circuit, and the second delay path of the programmable delay circuit is between a second delay input and the output of the programmable delay circuit.
13. The system of clause 12, wherein the programmable delay circuit comprises:
   a first NAND gate having a first input coupled to the first delay input and a second input coupled to the first control input;

a second NAND gate having a first input coupled to the second delay input and second input coupled to the second control input; and a third NAND gate having a first input coupled to an output of the first NAND gate, a second input coupled to an output of the second NAND gate, and an output coupled to the output of the programmable delay circuit.

14. A method for controlling a programmable delay circuit, comprising:

receiving a rising edge of a delay control signal;

outputting a rising edge of a first control signal to a first control input of the programmable delay circuit in response to the rising edge of the delay control signal;

after outputting the rising edge of the first control signal, outputting a falling edge of a second control signal to a second control input of the programmable delay circuit in response to the rising edge of the delay control signal;

receiving a falling edge of the delay control signal;

outputting a rising edge of the second control signal to the second control input of the programmable delay circuit in response to the falling edge of the delay control signal; and after outputting the rising edge of the second control signal, outputting a falling edge of the first control signal to the first control input of the programmable delay circuit in response to the falling edge of the delay control signal.

15. The method of clause 14, further comprising setting a first timing margin between the falling edge of the first control signal and the rising edge of the second control signal using a first delay circuit.

16. The method of clause 15, wherein the first timing margin is approximately equal to a delay of the first delay circuit.

17. The method of clause 15 or 16, further comprising setting a second timing margin between the falling edge of the second control signal and the rising edge of the first control signal using a second delay circuit.

18. The method of clause 17, wherein the first timing margin is approximately equal to a delay of the first delay circuit, and the second timing margin is approximately equal to a delay of the second delay circuit.

19. The method of clause 18, wherein the first delay circuit comprises first delay buffers coupled in series, and the second delay circuit comprises second delay buffers coupled in series.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities. As used herein, "approximately" means within 15 percent of the stated value (i.e., within a range between 85 percent of the stated value and 115 percent of the stated value). For example, a first value approximately equal to a second value means that the first value is within a range between 85 percent and 115 percent of the second value. Also, the term "delay" refers to a time delay unless indicated otherwise.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising: a programmable delay circuit; and a control circuit configured to receive a delay control signal, the control circuit comprising: a first control signal generator coupled to a first control input of the programmable delay circuit, wherein the first control signal generator is configured to: output a rising edge of a first control signal to the first control input in response to a rising edge of the delay control signal; and output a falling edge of the first control signal to the first control input in response to a falling edge of the delay control signal; and a second control signal generator coupled to a second control input of the programmable delay circuit, wherein the second control signal generator is configured to: output a falling edge of a second control signal to the second control input in response to the rising edge of the delay control signal, wherein the second control signal generator outputs the falling edge of the second control signal after the first control signal generator outputs the rising edge of the first control signal; and output a rising edge of the second control signal to the second control input in response to the falling edge of the delay control signal, wherein the first control signal generator outputs the falling edge of the first control signal after the second control signal generator outputs the rising edge of the second control signal, Wherein the first control signal generator comprises a first delay circuit configured to set a first timing margin between the falling edge of the first control signal and the rising edge of the second control signal.

2. The system of claim 1, wherein the first delay circuit has a tunable delay.

3. The system of claim 1, wherein the first delay circuit comprises delay buffers coupled in series.

4. The system of claim 1, wherein the second control signal generator comprises a second delay circuit configured to set a second timing margin between the falling edge of the second control signal and the rising edge of the first control signal.

5. The system of claim 4, wherein the first delay circuit comprises first delay buffers coupled in series, and the second delay circuit comprises second delay buffers coupled in series.

6. The system of claim 4, wherein the first delay circuit has a first tunable delay, and the second delay circuit has a second tunable delay.

7. The system of claim 1, wherein the first control signal generator comprises:

a first exclusive-OR (XOR) gate having a first input coupled to a supply rail, a second input configured to receive the delay control signal, and an output;

a first NAND gate having a first input coupled to the output of the first XOR gate, a second input, and an output coupled to the first control input of the programmable delay circuit; and a first delay circuit coupled between the output of the first XOR gate and the second input of the first NAND gate.

8. The system of claim 7, wherein the second control signal generator comprises:

a second XOR gate having a first input coupled to a ground, a second input configured to receive the delay control signal, and an output;

a second NAND gate having a first input coupled to the output of the second XOR gate, a second input, and an output coupled to the second control input of the programmable delay circuit; and a second delay circuit coupled between the output of the second XOR gate and the second input of the second NAND gate.

9. The system of claim 1, wherein the programmable delay circuit includes a first delay path, and the programmable delay circuit is configured to enable the first delay path when a logic state at the first control input is one and disable the first delay path when the logic state at the first control input is zero.

10. The system of claim 9, wherein the programmable delay circuit includes a second delay path, and the programmable delay circuit is configured to enable the second delay path when a logic state at the second control input is one and disable the second delay path when the logic state at the second control input is zero.

11. The system of claim 10, wherein the first delay path is between a first delay input of the programmable delay circuit and an output of the programmable delay circuit, and the second delay path of the programmable delay circuit is between a second delay input and the output of the programmable delay circuit.

12. The system of claim 11, wherein the programmable delay circuit comprises:

a first NAND gate having a first input coupled to the first delay input and a second input coupled to the first control input;

a second NAND gate having a first input coupled to the second delay input and second input coupled to the second control input; and a third NAND gate having a first input coupled to an output of the first NAND gate, a second input coupled to an output of the second NAND gate, and an output coupled to the output of the programmable delay circuit.

13. A method for controlling a programmable delay circuit, comprising: receiving a rising edge of a delay control signal; outputting a rising edge of a first control signal to a first control input of the programmable delay circuit in response to the rising edge of the delay control signal; after outputting the rising edge of the first control signal, outputting a falling edge of a second control signal to a second control input of the programmable delay circuit in response to the rising edge of the delay control signal; receiving a falling edge of the delay control signal; outputting a rising edge of the second control signal to the second control input of the programmable delay circuit in response to the falling edge of the delay control signal; and after outputting the rising edge of the second control signal, outputting a falling edge of the first control signal to the first control input of the programmable delay circuit in response to the falling edge of the delay control signal, The method further comprising setting a first timing margin between the falling edge of the first control signal and the rising edge of the second control signal using a first delay circuit.

14. The method of claim 13, wherein the first timing margin is approximately equal to a delay of the first delay circuit.

15. The system of claim 13, further comprising setting a second timing margin between the falling edge of the second control signal and the rising edge of the first control signal using a second delay circuit.

16. The method of claim 15, wherein the first timing margin is approximately equal to a delay of the first delay circuit, and the second timing margin is approximately equal to a delay of the second delay circuit.

17. The method of claim 16, wherein the first delay circuit comprises first delay buffers coupled in series, and the second delay circuit comprises second delay buffers coupled in series.

* * * * *